(12) United States Patent
Streubel

(10) Patent No.: US 8,471,385 B2
(45) Date of Patent: *Jun. 25, 2013

(54) METHOD FOR THE CONNECTION OF TWO WAFERS, AND A WAFER ARRANGEMENT

(75) Inventor: Klaus Streubel, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/966,555

(22) Filed: Dec. 13, 2010

(65) Prior Publication Data

US 2011/0079911 A1   Apr. 7, 2011

Related U.S. Application Data

(62) Division of application No. 11/068,291, filed on Feb. 28, 2005, now Pat. No. 7,872,210.

(30) Foreign Application Priority Data

Feb. 27, 2004 (DE) .......................... 10 2004 009 625
Mar. 11, 2004 (DE) .......................... 10 2004 012 013

(51) Int. Cl.
*H01L 23/488* (2006.01)

(52) U.S. Cl.
USPC .................. 257/772; 257/779; 257/E21.088; 257/E21.122; 257/E23.106

(58) Field of Classification Search
USPC .................. 257/772, 779, E21.088, E21.122, 257/E23.106
See application file for complete search history.

(56) References Cited

U.S. PATENT DOCUMENTS

| | | | |
|---|---|---|---|
| 3,939,556 A | 2/1976 | Borel et al. | |
| 3,942,244 A * | 3/1976 | Flohrs et al. | 438/573 |
| 4,737,232 A | 4/1988 | Flicstein et al. | |
| 4,772,935 A | 9/1988 | Lawler et al. | |
| 5,037,780 A | 8/1991 | Fujimoto et al. | |
| 5,460,318 A | 10/1995 | Boudreau et al. | |
| 5,481,082 A | 1/1996 | Yamamoto | |
| 5,500,540 A | 3/1996 | Jewell et al. | |
| 5,837,561 A * | 11/1998 | Kish et al. | 438/47 |
| 5,904,795 A | 5/1999 | Murakami et al. | |
| 6,020,252 A | 2/2000 | Aspar et al. | |
| 6,043,985 A | 3/2000 | Azdasht et al. | |
| 6,214,427 B1 | 4/2001 | Levinson | |
| 6,235,141 B1 * | 5/2001 | Feldman et al. | 156/250 |
| 6,268,659 B1 * | 7/2001 | Huebner et al. | 257/766 |
| 6,277,696 B1 | 8/2001 | Carey et al. | |
| 6,280,523 B1 * | 8/2001 | Coman et al. | 117/101 |

(Continued)

FOREIGN PATENT DOCUMENTS

DE   42 19 132 A1   6/1992
DE   196 46 476       5/1998

(Continued)

*Primary Examiner* — David Vu
*Assistant Examiner* — Earl Taylor
(74) *Attorney, Agent, or Firm* — Cozen O'Connor

(57) ABSTRACT

A method for the connection of two wafers in which a contact area is formed between the two wafers by placing the two wafers one on top of the other. The contact area is heated locally and for a limited time. A wafer arrangement comprises two wafers which have been placed one on top of the other and between whose opposite surfaces a contact area is located. The wafers are connected to one another at selected areas of the contact area.

21 Claims, 2 Drawing Sheets

U.S. PATENT DOCUMENTS

| | | | |
|---|---|---|---|
| 6,281,032 B1 * | 8/2001 | Matsuda et al. | 438/42 |
| 6,284,998 B1 | 9/2001 | Sinkunas et al. | |
| 6,328,796 B1 * | 12/2001 | Kub et al. | 117/94 |
| 6,406,583 B1 * | 6/2002 | Harden et al. | 156/250 |
| 6,406,636 B1 * | 6/2002 | Vaganov | 216/2 |
| 6,420,199 B1 * | 7/2002 | Coman et al. | 438/22 |
| 6,423,613 B1 | 7/2002 | Geusic | |
| 6,451,150 B2 * | 9/2002 | Feldman et al. | 156/250 |
| 6,576,870 B2 | 6/2003 | Wu | |
| 6,667,225 B2 * | 12/2003 | Hau-Riege et al. | 438/462 |
| 6,739,764 B2 | 5/2004 | Ido et al. | |
| 6,746,889 B1 * | 6/2004 | Eliashevich et al. | 438/33 |
| 6,762,072 B2 | 7/2004 | Lutz | |
| 6,822,326 B2 | 11/2004 | Enquist et al. | |
| 6,846,703 B2 * | 1/2005 | Shimoda et al. | 438/109 |
| 6,872,983 B2 | 3/2005 | Liu | |
| 6,941,063 B2 | 9/2005 | Camm et al. | |
| 7,001,829 B1 | 2/2006 | Yamazaki | |
| 7,105,424 B2 * | 9/2006 | Tsai et al. | 438/464 |
| 7,135,713 B2 * | 11/2006 | Chen | 257/98 |
| 7,153,758 B2 * | 12/2006 | Hata et al. | 438/455 |
| 7,186,629 B2 * | 3/2007 | Wesselmann et al. | 438/460 |
| 7,192,841 B2 * | 3/2007 | Wei et al. | 438/455 |
| 7,306,959 B2 | 12/2007 | Liu | |
| 7,319,048 B2 * | 1/2008 | Lu et al. | 438/106 |
| 7,422,915 B2 * | 9/2008 | Chen | 438/22 |
| 7,872,210 B2 * | 1/2011 | Streubel | 219/121.85 |
| 2001/0014514 A1 | 8/2001 | Geusic | |
| 2001/0032702 A1 * | 10/2001 | Feldman et al. | 156/297 |
| 2002/0076902 A1 | 6/2002 | Geusic | |
| 2003/0010431 A1 * | 1/2003 | Feldman et al. | 156/250 |
| 2003/0111667 A1 * | 6/2003 | Schubert | 257/98 |
| 2003/0113976 A1 * | 6/2003 | Hau-Riege et al. | 438/400 |
| 2003/0143772 A1 * | 7/2003 | Chen | 438/47 |
| 2003/0199105 A1 * | 10/2003 | Kub et al. | 438/3 |
| 2004/0012838 A1 * | 1/2004 | Huibers | 359/291 |
| 2004/0016995 A1 * | 1/2004 | Kuo et al. | 257/678 |
| 2004/0029336 A1 * | 2/2004 | Harpster et al. | 438/202 |
| 2004/0033638 A1 | 2/2004 | Bader et al. | |
| 2005/0001224 A1 * | 1/2005 | Chen | 257/98 |
| 2005/0001226 A1 * | 1/2005 | Chen | 257/98 |
| 2005/0194690 A1 | 9/2005 | Ishii et al. | |
| 2005/0211678 A1 * | 9/2005 | Streubel | 219/121.64 |
| 2006/0220031 A1 | 10/2006 | Krames et al. | |
| 2010/0181583 A1 * | 7/2010 | Peter et al. | 257/94 |
| 2011/0079911 A1 * | 4/2011 | Streubel | 257/772 |

FOREIGN PATENT DOCUMENTS

| | | |
|---|---|---|
| DE | 103 03 978 A1 | 1/2003 |
| EP | 0 232 935 | 8/1987 |
| EP | 0 539 741 | 5/1993 |
| EP | 0 758 145 | 2/1997 |
| EP | 0 981 159 A1 | 8/1998 |
| EP | 1 369 912 A2 | 3/2003 |
| GB | 2 244 374 | 11/1991 |
| WO | WO 02/19439 A1 | 3/2002 |
| WO | WO 2004/015756 | 2/2004 |

* cited by examiner

METHOD FOR THE CONNECTION OF TWO WAFERS, AND A WAFER ARRANGEMENT

CROSS-REFERENCE TO RELATED APPLICATIONS

This application is a divisional of U.S. patent application Ser. No. 11/068,291 which was filed with the U.S. Patent and Trademark Office on Feb. 28, 2005 now U.S. Pat. No. 7,872,210 which claims priority from German Applications Nos. 10 2004 009 625.2 filed Feb. 27, 2004 and 10 2004 012 013.7 filed Mar. 11, 2004. The entire disclosures of each of these applications are expressly incorporated herein by reference.

FIELD OF THE INVENTION

The invention relates to a method for the connection of two wafers. The invention also relates to a wafer arrangement.

BACKGROUND OF THE INVENTION

A method for the soldering of an electronic component to a dielectric substrate is known from the document U.S. Pat. No. 6,284,998 B1. For this purpose, at least two connecting points composed of metal are provided on a surface of the substrate and are each covered with solder paste. The connections of the electronic component are then brought into contact with the connecting points on the substrate. The beam of a diode laser is then directed through that side of the substrate that is opposite the connecting points onto in each case one of the metallic connecting points until the solder paste on that connecting point melts. The wavelength of the laser beam is in this case selected such that the laser energy is mainly absorbed by the connecting point and not by the dielectric substrate. Once the connecting point has cooled down, there is a soldered joint between the connecting point and the connection of the electronic component.

Document DE 103 03 978 A1 describes a method for the production of a semiconductor component, in which a thin film semiconductor body is soldered on a mount. For this purpose, solder metals are in each case applied to the thin film semiconductor body and to the mount. The thin film semiconductor body and the mount are then joined to one another at an increased pressure and at a temperature which is above the melting point of the solder metals involved.

SUMMARY OF THE INVENTION

One object of the present invention is to provide a method for facilitating the connection of two wafers.

Another object of the invention is to provide a wafer arrangement.

This and other objects are attained in accordance with one aspect of the present invention directed to a method for the connection of two wafers. A contact area is formed between the two wafers by placing the two wafers one on top of the other. The connection between the wafers is produced by heating the contact area on the two wafers locally and for a limited time.

In this context, locally limited heating means that significant heating of the wafers remains limited in a direction parallel to or at right angles to the contact area, preferably in both directions. After cooling down, the two wafers are then mechanically joined to one another in their contact area, at the location of the local heating.

In one embodiment of the method, two wafers are provided. A material is applied to at least one of the wafer surfaces. In this case, the material can be applied distributed over the entire wafer surface, or the material can be applied placewise to selected areas of the wafer surface, or the material can be applied distributed over the entire wafer surface and can then be removed from selected areas, for example by being etched away. A contact area is then produced between the wafers by placing the wafers one on top of the other such that the applied material is located between the wafers. A mechanical joint is then produced between the wafers by locally, in particular locally limited, heating the material in the contact area for a limited time, said joint being effected or mediated by means of the material between the wafers.

In this case, the material may, for example, be selected in a suitable form such that the material is first of all melted by the local heating and then solidifies during the cooling down process, thereby forming a eutectic with the wafer material.

In a further embodiment of the method, materials are applied to the surfaces of both wafers. In this case, the material which is applied to the first wafer is different from the material which is applied to the second wafer.

The materials need not necessarily in this case be applied to the entire wafer surface, but can also be applied placewise, to selected areas of the wafer surface.

The two wafers are then placed one on top of the other in such a way that the materials are located between the wafers. The materials are then heated locally, in particular locally limited, and for a limited time in the contact area between the wafers produced in this way, so that the two different materials are joined in the heated area. This may be done, for example, by the two materials being melted and by the materials mixing in the melt. Increased mobility of the particles as a result of the heating is also feasible, so that a mixture of the materials occurs on account of particle diffusion.

In any case, after the contact area has been heated locally and for a limited time, a mechanical joint is produced between the wafers, said joint being mediated or effected by means of the materials between the wafers.

In one embodiment of the invention, the materials which are applied to the wafer surfaces in the contact area are solders.

In another embodiment, the solders are solder metals. In this case, the following solder metals are preferably used in the method: Au, AuSn, Pd, In, Pt.

During the local heating of the contact area, these solder metals melt and mix. Once the solder layer has cooled down and solidified, there is then a mechanical joint between the wafers.

In one embodiment of the method for the connection of two wafers, the contact area between the wafers is locally heated by means of at least one laser beam. In this case, it is irrelevant to the principle of the method whether a single laser beam is used in a time sequence, point by point, or, for example, a large number of laser beams are used at the same time at different points of the contact area.

The wavelength of the laser and at least one of the wafers are in this case matched to one another such that at least one of the wafers is at least partially transparent with respect to the laser beam. This means that a small amount of absorption of the energy of the laser beam will take place, at most, in the wafer.

The laser beam is then focused on the contact area between the wafers, through at least one of the wafers.

In one embodiment, the majority of the laser beam is absorbed by the material or the materials at the contact area between the wafers. This may be done, for example, by the materials at the contact area predominantly not being transparent for the laser beam, and absorbing the energy of the laser beam. This ensures that the contact area is heated, to be precise in a locally limited form around the area at which the focus of the laser beam is directed. The power of the laser can in this case be selected to be sufficiently high that a mechanical joint is produced between the two wafers at the contact area after cooling down.

In one embodiment of the method, the laser may in this case be operated in the continuous mode (e.g. in the continuous wave or cw mode).

For one embodiment of the method, a laser in pulsed mode operation is expedient. In this case, the dissipation of the heat which is produced at the contact area can be optimally set by appropriate selection of the pulse duration and pulse separation. The local limiting of the heating can thus be achieved in a particularly simple manner by means of a laser in the pulsed mode. The desired time limiting of the heating is also provided by the limited pulse duration in the case of a laser operated in the pulsed mode. In this case, an Nd:YAG laser is used for production of the laser beams in one possible embodiment of the method.

In a further embodiment of the described method, the laser beam is passed continuously over the entire contact area between the wafers. The laser beam may in particular be continuously guided or wielded over the entire contact area between the wafers. In this way, all areas of the contact area are locally heated in a limited manner, thus resulting in an areal mechanical joint between the two wafers over the entire contact area of the two wafers. The local heating of the contact area can in this case be produced successively by means of a single laser beam, or can be produced at the same time at two or more local areas on the contact area when using a large number of laser beams.

In another embodiment of the method, the laser is passed over selected areas of the contact area so that a joint between the two wafers is produced only in these selected areas. In particular, the laser beam may be guided or wielded over selected areas of the contact area. In this case, a joint is thus produced between the two wafers at selected points in the contact area, while other areas of the contact area between the wafers have no joint produced by direct heating. In this case, the shape, arrangement, number and size of the connection areas and of the areas where there is no connection can be configured depending on the product requirements.

This means that the shape, arrangement, number and size of the connecting areas and areas without any connection may, for example, be matched to the required temperature resistance, the preferred mechanical robustness, the method of operation of the component, or else to the desired costs of the product.

In this embodiment of the method as well, it is, of course, possible to use a single laser beam or a large number of laser beams.

In a further embodiment of the method, the joint between the two wafers is produced pointwise at the contact area. For this purpose, the laser beam is focused only on individual, predetermined points at the contact area. In this case, a joint is formed between the two wafers at these points. In this case, the individual connection points can be arranged according to a desired pattern. The connection points then form a dot pattern. The number of connection points and the configuration of the network may in this case be matched to the product requirements.

In this embodiment as well, it is possible to use one laser beam successively, or to use a large number of lasers at the same time. In particular, it is possible in this case for the number of laser beams to correspond to the number of desired connection points.

In one embodiment of the method, a material is applied only to those areas of the contact area which are afterwards irradiated by the laser beam. By way of example, when it is intended to produce a pointwise connection between the two wafers, material is applied in advance only at these points.

In one embodiment of the described method, at least one of the wafers contains a semiconductor material.

In a further embodiment of the method for the connection of two wafers, at least one of the wafers contains one of the following semiconductor materials: silicon, germanium, gallium arsenide, InP, GaP.

In one embodiment of the method, at least one of the wafers contains at least one of the following metals: Mo, Cu, CuW. Furthermore, in a further embodiment of the method, at least one of the wafers may contain ceramic materials.

In one embodiment of the method, at least one of the wafers comprises two or more individual layers, with at least one of the individual layers being an epitaxially applied layer.

In a further embodiment of the method, the epitaxially applied layer preferably contains one of the following semiconductor materials: GaInN, AlGaAs, AlGaInP, GaP, InP, InGaAs, InGaAsP, GaN, AlGaInN.

In this case, in one embodiment of the method, at least one individual layer of the wafer forms an electronic or microelectronic component.

In this case, in accordance with embodiments of the invention the electronic component forms an optoelectronic component, for example a light-emitting diode, a semiconductor laser or a detector (for example a photodiode).

Another aspect of the invention is directed to a wafer arrangement in which two wafers which have been placed one on top of the other are connected to one another at selected areas of their contact area.

This connection may, for example, be effected or mediated by means of a material, in particular a single material, or by means two different materials between the wafers.

The wafer arrangement is in this case based on the idea that the connection between two wafers does not extend areally over the entire contact area between two wafers, but the two wafers are connected to one another only at selected points of their contact area. In this case, the materials by means of which the connection between the wafers is produced can either be applied in the entire contact area or only at those points in the contact area at which a connection between the wafers is located.

In one embodiment of the wafer arrangement, the two wafers are connected to one another pointwise at connection points at their contact area. In this case, the sum of the surface areas of the contact area in which the two wafers are connected to one another is small in comparison to the sum of the surface areas of the contact area in which there is no connection between the two wafers.

In one embodiment of the wafer arrangement, the connection points are in this case arranged according to a desired pattern.

In one embodiment of the described wafer arrangement, at least one of the wafers contains a particularly temperature-sensitive layer. This means that the maximum temperature to which this layer can be heated without damage is lower, for example, than the temperature at which the materials are joined to one another at the contact area. In this case, heating of the entire wafer arrangement to the temperature at which the materials are joined would damage the temperature-sensitive layer.

DETAILED DESCRIPTION OF THE DRAWINGS

Figure 1:
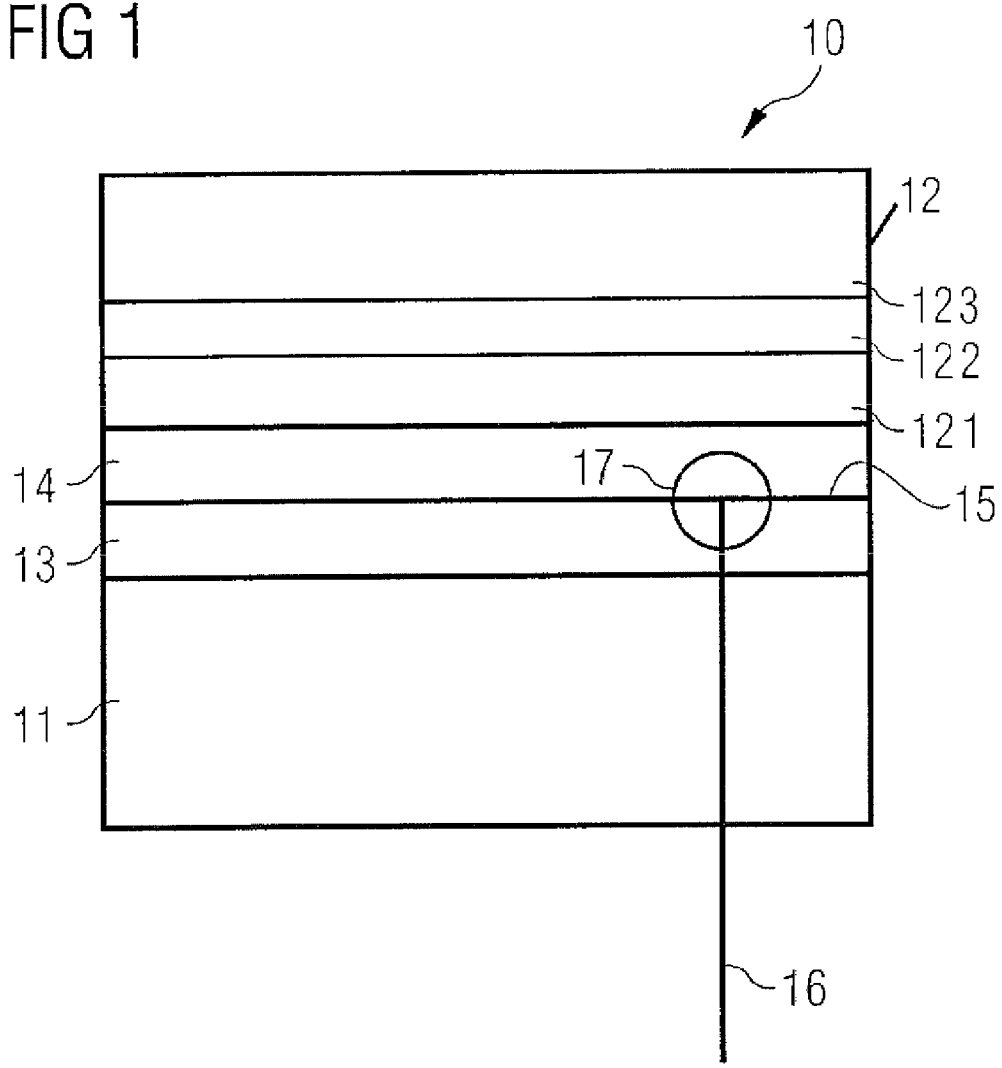
FIG. 1 shows an outline sketch of the method described here for the connection of two wafers on the basis of the production of an AlGaInP thin-film light-emitting diode.

FIG. 1 explains a method for the production of an AlGaInP thin-film light-emitting diode 10. By way of example, a GaAs mount wafer 11 and an epitaxial wafer 12 with an AlGaInP light-emitting diode layer, which is applied epitaxially to a GaAs substrate, are provided for this purpose.

In one embodiment, two wafers are provided and material is applied to surfaces of both wafers. By way of example, an AuSn solder layer 13 is applied to the upper face of the mount wafer 11. By way of example, an Au solder layer 14 is applied to the lower face of the epitaxial wafer 12. The solder layers 13, 14 may in this case completely cover the surfaces of the respective wafers 11, 12, or may be applied only to specific areas of the wafer surfaces. In this case, it is, of course, irrelevant to the described method which of the solder metals is applied to which of the two wafers.

In one embodiment, at least one of the wafers 11, 12 may comprise two or more individual layers. For example, wafer 12 may comprise three individual layers 121, 122, and 123, as shown in FIG. 1.

The laser beam 16, for example the beam of an Nd:YAG laser, is then radiated through the mount wafer 11 at a wavelength at which the mount wafer 11 is transparent with respect to the laser beam 16. In this case, the laser beam 16 is focused on the contact area 15 between the two wafers. Furthermore, however, it is also possible for the laser beam 16 to be focused through the epitaxial wafer 12 on the contact layer 15.

The power of the laser is in this case chosen such that the two solder layers 13, 14 melt locally around the focus of the laser, so that the two solders are joined to one another and a local soldered joint is produced between the two wafers 11 and 12 once the locally heated area 17 has cooled down and solidified. The laser may in this case be operated both in the continuous mode or else in the pulsed mode.

If, during this process, the laser beam is passed continuously over the entire contact area 15, then this results in an areal solder-joint between the two wafers 11, 12.

It is self-evident that other mount wafers may also be used in addition to the GaAs wafer that has been mentioned. For example, it is also possible to use wafers which include germanium or silicon. If necessary, the wavelength of the laser beam must then be adapted so that the mount wafer is at least partially transparent for the laser beam.

In another embodiment, two wafers are provided but material is applied to only one of the wafers. In such a case, the material and the other wafer (i.e., to which the material is not applied) form an eutectic when the material is heated in the contact area. One possible combination of material and wafer is gold and germanium, respectively. This combination results in a GeAu eutectic.

There are also numerous options for the choice of the epitaxial wafer. For example, the epitaxial wafer may include a laser diode layer or a detector layer. In particular, the specified method is suitable for the soldering of temperature-sensitive components, since only a locally limited area 17 is heated rather than the entire wafer arrangement.

Furthermore, there are no restrictions to the choice of the solder metals for the described method. Since the thermal load in the described method is locally restricted to the contact area between the wafers, combinations of solder metals, in particular, are feasible which do not produce a joint until much higher temperatures than the Au and AuSn solders that have been mentioned.

In case at least one of the wafers comprises a semiconductor material the wavelength of the laser is selected according to the band-gap of the semiconductor material. As is well known for a person of ordinary skill the art, for wavelengths corresponding to energy smaller than the band-gap the wafer appears transparent. The beam focus is directed to the contact area and can, therefore, be easily adjusted, for example to the actual wafer thickness and the distance of laser source and contact area. Pulse duration and pulse separation depend on the used materials. Adjustments of these parameters is well known to a person with ordinary skill in the art.

Once the two wafers 11, 12 have been joined, the wafer arrangement can be separated into individual components—for example individual light-emitting diode chips. This may be done, for example, by sawing or breaking of the arrangement. Electrical contact can be made with the finished component from the side of the mount wafer 11. The solders 13, 14 are then preferably electrically conductive.

Figure 2:
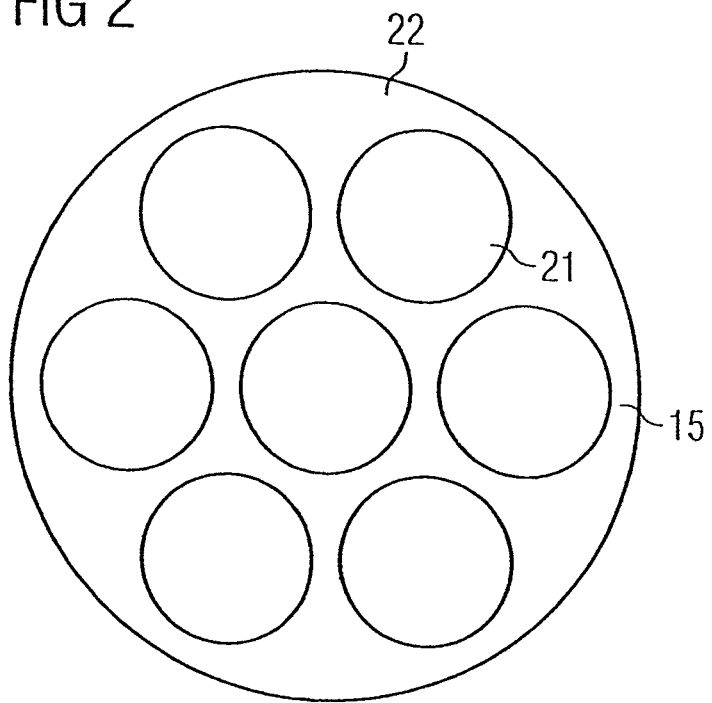
FIG. 2 shows a schematic plan view of the contact area of the wafer arrangement described here, in which the two wafers are soldered at selected areas in the contact area.

FIG. 2 shows a schematic plan view of the contact area 15 between two wafers. The two wafers are soldered to one another only at the selected connection areas 21 of the contact area 15. In addition to the connection areas 21, there are also connection-free areas 22 of the contact area 15, where there is no joint between the two wafers.

In this case, the solder metals may either be applied to the wafer only in the connection areas 21, or the solder metals may be applied to the entire contact area 15, distributed over the wafer surfaces.

The shape, size, number and arrangement of the selected connection areas 21 and of the connection-free areas 22 may in this case be adapted, depending on the requirements of the wafer arrangement.

Figure 3:
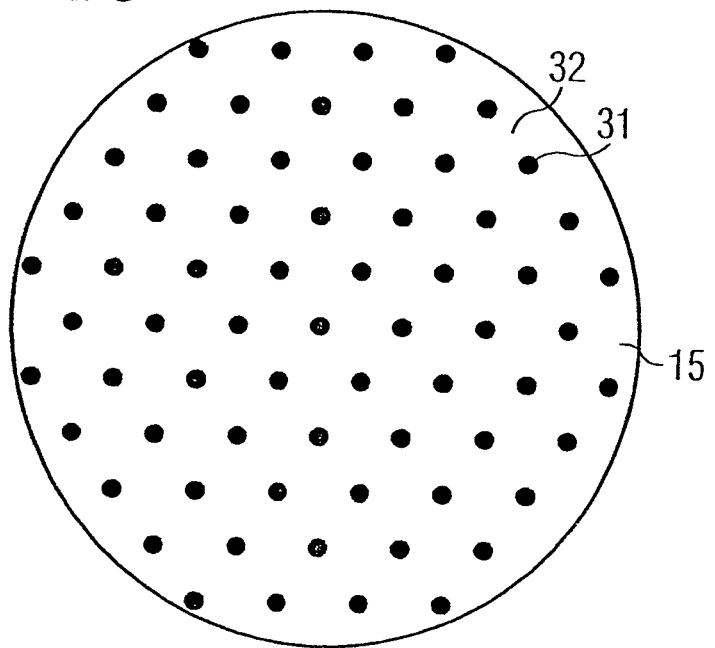
FIG. 3 shows a plan view of the contact area of the wafer arrangement described here, with the two wafers being soldered pointwise.

FIG. 3 shows a plan view of the contact area 15 on the wafer arrangement described here. In this case, the two wafers are joined to one another at junction points 31 of the contact area 15. The junction points 31 are in this case arranged at the nodes of a regular network. The connection-free area 32 in this case occupies a far larger surface area of the contact area 15 than the total surface area of the junction points 31.

In this case, it is either possible to apply the solder metals just to the junction points 31 on the wafers, or to apply the solder metals to the wafer surfaces over the entire contact area 15.

The number and arrangement of the junction points 31 are in this case matched to the requirements of the wafer arrangement and to the requirements for the component to be produced. Once the wafer arrangement has been separated, components may result in this exemplary embodiment with which electrical contact is made only at points from the side of the mount wafer 11.

Since the temperature load is particularly low when the two wafers are joined only at points, this wafer arrangement is particularly suitable, for example, when at least one of the wafers contains a temperature-sensitive component. This is because, when the two wafers are joined at points, the temperature load of the wafers is raised slightly only at a few points on the wafer arrangement, and the overall rise in temperature load is in this case very low.

In the two last-mentioned exemplary embodiments, it is also possible for one, and only one, component to result per junction point 31 or per connection area 21. This means that, for example, it is possible for the wafers 11, 12 not to be connected to one another at points at which the wafer arrangement is intended to be separated (for example at weak points or on sawing channels). The two wafers 11, 12 are then joined only where the components are intended to be produced.

Although heating of the material has been described as being done by a laser beam, it should be understood that other heat sources can be used, such as directing an acoustic ultrasonic wave to the contact area.

The scope of protection of the invention is not limited to the examples given herein above. The invention is embodied in each novel characteristic and each combination of characteristics, which particularly includes every combination of any features which are stated in the claims, even if this feature or this combination of features is not explicitly stated in the claims or in the examples.

I claim:

1. A wafer arrangement, comprising:
   two wafers placed one on top of the other; and
   a contact area between planar surfaces of the two wafers; wherein:
   the two wafers are connected to one another at selected connection areas of the contact area,
   at least one of the two wafers is a silicon wafer, a germanium wafer, a gallium arsenide wafer, an InP wafer, a ceramic wafer or a GaP wafer,
   a mechanical joint between the two wafers is mediated or effected by a material between the planar surfaces of the two wafers, wherein said material is applied as a continuous layer entirely covering the planar surfaces of the two wafers in the contact area, wherein the contact area comprises connection-free areas arranged therein where there is no mechanical joint between the two wafers,
   at least one of the two wafers comprises two or more individual layers, and
   at least one of the two or more individual layers is an epitaxially applied layer comprising an active layer configured to produce or to detect radiation, and wherein at least one of the two or more individual layers is part of an optoelectronic component.

2. The wafer arrangement as claimed in claim 1, wherein the mechanical joint between the two wafers comprises junction points in the contact area.

3. The wafer arrangement as claimed in claim 2, wherein the junction points are arranged at nodes of a regular network.

4. The wafer arrangement as claimed in claim 1, wherein one of the wafers is a growth substrate for the epitaxially applied layer.

5. The wafer arrangement as claimed in claim 1, wherein each of the two wafers has the same length in a lateral direction.

6. The wafer arrangement as claimed in claim 1, wherein at least one additional material is applied to one of the wafers, the additional material being different from the material.

7. The wafer arrangement as claimed in claim 6, wherein the at least one additional material is solder.

8. The method as claimed in claim 7, wherein the solder is selected from the following materials: Au, AuSn, Pd, In and Pt.

9. The wafer arrangement as claimed in claim 6, wherein the at least one additional material is mixed in a melt.

10. The wafer arrangement as claimed in claim 1, wherein at least one of the two wafers is transparent with respect to a laser beam.

11. The wafer arrangement as claimed in claim 10, wherein the material is not transparent to the laser beam.

12. The wafer arrangement as claimed in claim 1, wherein the epitaxially applied layer comprises at least one of the following semiconductor materials: GaInN, AlGaAs, AlGaInP, GaP, InP, InGaAs, InGaAsP, GaN and AlGaInN.

13. The wafer arrangement as claimed in claim 1, wherein at least one of the two wafers comprises at least one of the following materials: Mo, Cu and CuW.

14. The wafer arrangement as claimed in claim 1, wherein a sum of the surface areas of the contact area in which the two wafers are connected to one another is less than a sum of the surface areas of the contact area in which there is no connection between the two wafers.

15. The wafer arrangement as claimed in claim 1, wherein the two wafers are not connected to one another at separation points of the wafer arrangement.

16. A wafer arrangement, comprising:
    two wafers placed one on top of the other; and
    a contact area between planar surfaces of the two wafers, wherein:
    the two wafers are connected to one another at selected connection areas of the contact area, and
    a mechanical joint between the two wafers is mediated or effected by a material between the planar surfaces of the two wafers, wherein said material is applied as a continuous layer entirely covering the planar surfaces of the two wafers in the contact area, wherein the contact area comprises connection-free areas arranged therein where there is no mechanical joint between the two wafers.

17. The wafer arrangement as claimed in claim 16, wherein the mechanical joint between the two wafers comprises junction points in the contact area.

18. The wafer arrangement as claimed in claim 17, wherein the junction points are arranged at nodes of a regular network.

19. The wafer arrangement as claimed in claim 16, wherein at least one of the wafers includes at least one temperature-sensitive layer, such that a maximum temperature to which the temperature-sensitive layer can be heated without damage is lower than a temperature at which the two wafers are joined together.

20. The wafer arrangement as claimed in claim 16, wherein a sum of the surface areas of the contact area in which the two wafers are connected to one another is less than a sum of the surface areas of the contact area in which there is no connection between the two wafers.

21. The wafer arrangement as claimed in claim 16, wherein the two wafers are not connected to one another at separation points of the wafer arrangement.

* * * * *

UNITED STATES PATENT AND TRADEMARK OFFICE
CERTIFICATE OF CORRECTION

PATENT NO. : 8,471,385 B2  
APPLICATION NO. : 12/966555  
DATED : June 25, 2013  
INVENTOR(S) : Klaus Streubel Page 1 of 1

It is certified that error appears in the above-identified patent and that said Letters Patent is hereby corrected as shown below:

In the Claims

Column 7, line 55 (claim 8, line 1) change "method" to --wafer arrangement--.

Signed and Sealed this
Twenty-second Day of October, 2013

Teresa Stanek Rea
*Deputy Director of the United States Patent and Trademark Office*